(12) United States Patent
Okada et al.

(10) Patent No.: US 7,431,867 B2
(45) Date of Patent: Oct. 7, 2008

(54) NANOSIZED SEMICONDUCTOR PARTICLES

(75) Inventors: Hisatake Okada, Tokyo (JP); Kazuya Tsukada, Tokyo (JP); Naoko Furusawa, Tokyo (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/624,287

(22) Filed: Jan. 18, 2007

(65) Prior Publication Data

US 2007/0187463 A1     Aug. 16, 2007

(30) Foreign Application Priority Data

Jan. 27, 2006   (JP) ............................. 2006-019239

(51) Int. Cl.
*H01B 1/00*   (2006.01)
*H01B 1/12*   (2006.01)

(52) U.S. Cl. ........................... 252/500; 430/217; 106/3; 361/56; 427/216

(58) Field of Classification Search ................ 252/33.2, 252/500; 427/216; 106/3; 361/56; 430/217
See application file for complete search history.

(56) References Cited

U.S. PATENT DOCUMENTS

| | | | | |
|---|---|---|---|---|
| 2,932,629 A | * | 4/1960 | Wiley | 526/226 |
| 5,489,449 A | * | 2/1996 | Umeya et al. | 427/450 |
| 5,690,807 A | * | 11/1997 | Clark et al. | 205/655 |
| 5,741,372 A | * | 4/1998 | Gugel | 148/276 |
| 6,582,763 B1 | * | 6/2003 | Nishimura et al. | 427/216 |
| 2005/0057867 A1 | * | 3/2005 | Harris et al. | 361/56 |
| 2007/0054984 A1 | * | 3/2007 | Jun et al. | 523/204 |
| 2007/0056465 A1 | * | 3/2007 | Dutta | 106/3 |

FOREIGN PATENT DOCUMENTS

WO   WO 2005/013337 A2  *  2/2005

* cited by examiner

*Primary Examiner*—Mark Kopec
*Assistant Examiner*—Khanh Tuan Nguyen
(74) *Attorney, Agent, or Firm*—Lucas & Mercanti, LLP

(57) ABSTRACT

Nanosized semiconductor particles of a core/shell structure is disclosed, wherein the particles each comprise a core and a shell and exhibit an average particle size of not more than 100 nm and a coefficient of variation in core size distribution of not more than 30%.

9 Claims, No Drawings

NANOSIZED SEMICONDUCTOR PARTICLES

This application claims priority from Japanese Patent Application No. JP2006-019239 filed on Jan. 27, 2006, which is incorporated hereinto by reference.

FIELD OF THE INVENTION

The present invention relates to nanosized semiconductor particles having a core/shell structure, and in particular to nanosized semiconductor particles of a core/shell structure in which the coefficient of variation of core particle size distribution and that of shelled nanoparticles size distribution fall respectively within 30% and a manufacturing method thereof.

BACKGROUND OF THE INVENTION

It is known that among ultramicroparticles of semiconductors or metals, nano-sized particles having a particle size smaller than the wavelength of an electron (ca. 10 nm), on which the influence of size finiteness on the movement of electrons increases as a quantum size effect, exhibit a specific physical property different from that of the bulk body, as described in Nikkei Sentan Gijutsu (Nikkei Advanced Technology), Jan. 27, 2003, pages 1-4. Nanosized semiconductor particles of a core/shell structure which are covered with a material different from the core portion of the nanoparticles can be functionalized without varying the size or the shape of core particles or are expected to display a characteristic different from that of the bulk material of the core or the shell, therefore, they are noted as a novel highly active catalyst, as a photo functional material or as a material for optical elements. When the surface of light-emitting nanoparticles is exposed, a number of defects existing on the nanoparticles surface become an emission killer, leading to lowering of emission efficiency. To overcome this, the emission intensity can be enhanced by covering the Nanoparticles with a shelling material exhibiting a band gap greater than the band gap corresponding to the emission wavelength of the Nanoparticles, and thereby form a core/shell structure.

With respect to luminescent nanoparticles, there were proposed, as a non-linear optical material, ultramicroparticles having an insulating layer mainly composed of silicon oxide on the surface of silicon nucleuses. Such a material is regarded as being useful as a high intensity light-emitting material achieving high quantum efficiency, as described in JP-A No. 5-224261 (hereinafter, the term, JP-A refers to Japanese Patent Application Publication.

Phosphor particles having nana-structured crystals coated with a glass component can exhibit excitation emission even at a relatively low voltage, leading to a high luminescence efficiency.

There was disclosed in JP-A No. 2005-120117 a phosphor of a core/shell structure, exhibiting high emission efficiency. This phosphor is comprised of a phosphor core at a particle size of 10 nm or less and including a first doping element forming an acceptor level and a second doping component forming a donor level in a semiconductor containing ZnS as a main first main constituent and a II-VI group compound semiconductor as an optional second constituent, and the core being dispersed in a shelling material exhibiting a band gave greater than the band gap corresponding to the emission wavelength of the phosphor.

Thus, an increased band gap energy can be accomplished by decreasing the core particle size to the nana-size level to exhibit quantum size effect and also by forming a core/shell structure, as described above. However, studies have not been made with respect to an effect of scattering in nanosized semiconductor particles size upon optical properties. Further, there cannot be readily accomplished an industrial scale production of nano-sized semiconductor particles exhibiting a uniform particle size distribution.

SUMMARY OF THE INVENTION

As described above, there is not known anything with respect to an effect of scattering in particle size upon optical properties of nanoparticles of a core/shell structure. The inventors discovered that when the particle size distribution of nanosized semiconductor particles and that of core particles each fall within a given range, enhancement of emission characteristics and emission efficiency was achieved. Based on such discoveries, the present invention has come into being. Thus, it is an object of the invention to provide nanosized semiconductor particles (hereinafter, also denoted as nanosized semiconductor particles) of a core/shell structure, exhibiting an appropriate limitation in scattering with respect to superior optical properties of an optical element, and a preparation method thereof.

One aspect of the invention is directed to nano-sized semiconductor particles of a core/shell structure comprising a core and a shell covering the core, wherein the particles exhibit an average particle size of not more than 100nm and the coefficient of variation of core size distribution is not more than 30%.

The nano-sized semiconductor particles of a core/shell structure are controlled so that the coefficient of variation of core size distribution and the particle size of the shelled particles respectively fall within given ranges, whereby optical characteristics are optimized. A particle size distribution falling within a relatively narrow range effectively results in quantum size effects and quantum confinement effect. Accordingly, the nanosized particles (or Nanoparticles) of the invention exhibit superior luminance and result in uniform light-emission color. The nanosized semiconductor particles of the invention are therefore usable as a high-luminescent light-emitting material or light-emitting device, exhibiting stable light-emission. Further, an increased filling ratio as a light-emitting device can form an illuminator comprised of a high density light-emitting device.

DETAILED DESCRIPTION OF THE INVENTION

The nanoparticle (or nano-sized particle) of the invention refers to an ultramicroparticle exhibiting a particle size on the nanometer order. The nanosized semiconductor particles may be in a spherical form, a rod form, a planar form or a tube form, but nanosized semiconductor particles obtained in the preparation method of the invention are assumed to be spherical or approximately spherical and the particle size thereof represents a diameter of the particle. The nanosized semiconductor particles of the invention usually exhibit not more than 1000nm of an overall particle size (which is the diameter of the combined portion having a core and a shell but also includes a polymer chain attached to the shell surface).

The coefficient of variation is below.

(standard deviation of particles)/(average particle size)×100%

This is a barometer indicating that a lower value is a more mono-dispersed particle group. In the invention, the particle size distribution, including the average particle size and a coefficient of variation can be determined by transmission electron microscopic (TEM) observation.

The nanosized semiconductor particles of the invention are those of a core/shell structure, in which shelled particles exhibit an average particle size of not more than 100nm and the coefficient of variation of core particles is not more than 30%.

The core/shell structure refers to a double structure which is comprised of a central Nan particle as a core portion (hereinafter, also denoted simply as a core) and a layer covering the core particle surface, as the shell portion (hereinafter, also denoted simply as a shell). When the nanoparticle surface is exposed, a number of defects on the nanoparticle surface function as an emission killer, resulting in reduced luminescence intensity, which is prevented by the core/shell structure. A shell portion comprised of a composition exhibiting a greater band gap than the core portion results in enhanced emission intensity, leading to longer life of luminescence and enhanced luminescence.

There will be further described the structure of the nanosized semiconductor particles of the invention. Material forming the core portion of the nanosized semiconductor particles contains preferably at least one element selected from the group of B, C, N, Al, Si, P, S, Zn, Ga, Ge, As, Cd, In, Sb and Te, more preferably at least one element of Si and Ge and still more preferably Si or its compound, or Ge or its compound. In nanosized semiconductor particles having a core of silicon or germanium, when the particle size is reduced to a region resulting in quantum confinement effects, the band gap energy is moved to the visible region, resulting in emission.

The core portion is preferably a single crystal. In the case of optical elements, for example, a particulate phosphor, such as a single crystal, as described in JP-A No. 2000-265166, can attain enhanced emission efficiency.

The shell portion is a layer covering the core portion. Material for the shell portion is preferably comprised of a compound of II to VI group of the periodical table. The core/shell structure is preferably one in which the shell portion is comprised of a composition exhibiting a greater band gap than the core portion.

Nanosized semiconductor particles, as described above are not specifically limited and include semiconductor crystals, for example, a II-VI group compound, i.e., a compound comprised of II and VI group elements, such as CdS or CdSe; a III-V group compound, such as InAs; and a IV group semiconductor. Specific examples of a core/shell structure include Si (core)/$SiO_2$(shell), CdS (core)/$SiO_2$(shell), CdS (core)/CdSe (shell), CdSe (core)/CdS (shell), CdS (core)/ZnS (shell) and CdSe (core)/ZnSe (shell).

In a specifically preferred embodiment, the core portion is a silicon nucleus and the shell portion is a layer mainly containing silicon oxide. The layer containing mainly silicon oxide refers to a shell layer including silicon dioxide ($SiO_2$) as the main component. The silicon nucleus of the core portion is preferably a single crystal. In nanosized semiconductor particles of such a core/shell structure, the excitation energy for Si of the core portion is 1.1eV and that for $SiO_2$ of the shell portion is 8eV, resulting in greater band gap energy than CdSe/ZnS nanoparticles comprising a core (ZnS) of 3.6eV and a shell (CdSe) of 1.7eV. Nanosized silicone (Si)/silica ($SiO_2$) type semiconductor particles reduce environmental load and exhibit superior biostability.

To stably achieve enhanced emission efficiency, the core size and the shell size are limited preferably as follows. In one preferred embodiment of the nanosized semiconductor particles of a core/shell structure, the core particle size is 1nm or more and the shell layer thickness is 0.2nm or more, while the ratio of the shell layer thickness to the core particle size is from $1/100$ to $1/2$.

The core particle size (or core diameter) is preferably 1-60nm, and more preferably 2-20nm. A core particle size of less than 1 nm renders it difficult to adjust the core particle size, making it difficult to obtain uniform core particles exhibiting a variation coefficient of core size of not more than 30%. When the sum of a core particle size and a shell layer thickness exceeds 100nm, such particles often exhibit properties of a bulk body. To allow nanoparticles to obtain quantum effects, therefore, the particle size of shelled particles is preferably not more than 100nm.

In nanosized semiconductor particles, an extremely thin shell layer, as compared to the core particle size, results in lowering of emission efficiency, leading to unstable luminance. An excessively thick shell layer results in deteriorated emission stability, rendering it difficult to uniformly cover the core surface.

In the case of a core particle size of less 20nm, the shell thickness is preferably not less than 0.2nm and the ratio of shell thickness to core particle size is preferably not more than $1/2$. A shell thickness of less than 0.2nm results in atoms or molecules. A shell thickness of at least 0.2 nm is needed to avoid aggregation of core particles.

Such particle sizes, as compared to a bulky structure, result in superior light absorption characteristics and emission characteristics through exaction confinement as a quantum effect and electrostatic effects. Thus, the absorption spectrum and fluorescence spectrum are controllable by particle sizes. Specifically, exposure of nanosized semiconductor particles to excitation light such as ultraviolet rays results in fluorescence at a specific wavelength depending on particle sizes. Accordingly, nanoparticulate semiconductor reagents differing in particle size enable multicolor emission from a single light source.

Nanosized semiconductor particles having a core diameter and a shell thickness falling within the foregoing range, which maximally enhance emission efficiency and can optimally control or freely design emission spectrum, while maintaining emission stability, are of great promise as luminous microparticles, for example, nanosized multi-color luminescence phosphor particles. These are applicable to fluorescent reagents or labeled substances, preferably in the state of a stably dispersed suspension or being fixed onto a substrate.

In the case of a core particle size of 20 to 60nm, the shell thickness is preferably not less than $1/10$ of the core particle size and not more than $1/2$.

JP-A No. 2004-296781 discloses that the size of nanosilicon, which can directly contribute to emission color as a light-emitting device, can be controlled by subjecting it to a hydrofluoric acid treatment or an oxidation treatment, whereby visible emission of red, green or blue is variable. Accordingly, deposition of nanosized semiconductor particles of the foregoing size on an appropriate substrate can obtain, for example, a phosphor exhibiting a high quantum yield. Such a light-emitting material, which can be excited at a relatively low voltage and results in high-intensity emission, is preferred as a practical high-intensity luminance material. Long-life and stable emission leads to enhanced visibility and making the foregoing light-emitting material suitable specifically as fluorescent material for flat panel displays and as a solid state component for displays or illumination. When applying the nanosized semiconductor particles of the invention to light-emitting material, shelled particles which exhibit 30% or less of a coefficient of variation of particle size and relatively uniform particle size distribution, increases the packing density of light-emitting particles in a light-emitting material, leading to a light-emitting material comprised of high-density light-emitting elements.

The nanosized semiconductor particles of the invention are of great promise as light-emitting particles of superior performance and the particle size thereof is in the nana-order, so that an aggregate of such ultra-micro particles displays characteristics differing from bulky particles. With respect to optical characteristics of nanoparticles in relation to particle size distribution, the size of nanoparticles greatly affect emission efficiency as a quantum effect and a broad particle size distribution, in other words, a large value of coefficient of variation of particle size does not bring about increased quantum yield. Resultantly, either a light-emitting substance as a labeled molecule or light-emitting material fixed onto a substrate exhibits no longer high performance.

The coefficient of variation in particle size distribution is limited preferably to 30% or less with respect to core particle size and shelled nanoparticles of the semiconductor Nanoparticles of the invention. Such limitation allows scattering in particle size distribution to fall within a range as narrow as possible, leading to improvement in quantum yield. In the preparation of core particles, allowing the coefficient of variation of particle size to fall within 30% or less (preferably 20% or less) results in core particles of approximately uniform sizes. Further, uniformly covering the surface of the core particles of approximately uniform sizes is expected to result in shelled particles of an approximately uniform size. Accordingly, the coefficient of variation in particle size distribution of the shelled Nanoparticles becomes 30% or less and preferably 20% or less.

A critical effect of limiting the coefficient of variation of particle size distribution to 30% or less is due to the fact that when the coefficient of variation exceeds 30%, the half-width of an emission peak greatly increases and overlapping with the emission of particles of other particle sizes becomes greater, leading to deteriorated detectability. Allowing a coefficient of variation of particle size distribution to fall within 30% can achieve enhanced optical characteristics of light-emitting nanoparticles. Emission at the wavelengths near 500nm greatly contributes to luminance and a high coefficient of variation increases probability of emission of the nanoparticles deviating from the visible region, resulting in lowering of luminance.

Methods for preparing nanosized semiconductor particles of a core/shell structure are not specifically limited, and there are known, for example, a gas phase process and a liquid phase process (e.g., a reversed micelle method, a hot soap method, and a method employing coprecipitation). However, because of nanosized semiconductor particles being ultramicroparticles, it is not easy to achieve manufacturing, efficiently and on a large-scale, a uniform nanoparticle group of little scatter in particle size distribution. In many cases, manufacturing of nanoparticles needs simultaneous formation of a large number of nuclei to reduce particle sizes, so that a precursor concentration in a reaction system must be rapidly increased at the time of nucleation (as described in JP-A No. 2003-225900). Non-homogeneity of a precursor concentration or temperature in a reaction system unavoidably occurs in that stage. Non-homogeneity occurring under such conditions greatly affects the particle size distribution of nanoparticles, specifically in scale-up production (as described in JP-A No. 2003-225900).

In one aspect of the method of manufacturing nanosized semiconductor particles of the invention, reaction conditions for core formation and reaction conditions for shell formation are controlled so that the coefficient of core particle size distribution and the average particle size of shelled particles fall within 30% or less and 30% or less, respectively. In the method of preparing nanosized semiconductor particles of the invention, the particle size of the core portion and the coefficient of variation in particle size distribution of shelled nanoparticles are controlled optimally for the respective conditions of core formation and shell formation. Such controlled conditions and specific contents thereof are variable, depending on a method of forming a core and a method of covering the core with a shell. Namely, conditions, for example, of a concentration of a compound constituting the core portion, contact time or contact method of the compound, reaction time, temperature, pressure, nozzle diameter and other treatment conditions are controlled so that the average core particle size and the coefficient of variation of the shelled particles fall within the desired range. There may optionally be conducted a treatment for preventing coagulation of the thus formed nanoparticles, for example, by addition of a coagulation-preventing agent, as described in JP-A No. 2005-68326. Selection and design of specific conditions on an individual basis of the nanoparticles are feasible for a person skilled in the art.

The key making narrow the particle size distribution of nanoparticles or to reduce the coefficient of variation of the distribution is to secure uniformity in conditions within the reaction system. The inventors of this application noted the foregoing and worked toward designation of preferred embodiments of the reaction system to control the particle size distribution of core particles and the particle size of shelled particles and the distribution thereof (that is, the coefficient of variation) in manufacturing nanosized semiconductor particles. As a result, there was adopted a system in which two reactant solutions, as precursor solutions to form nanoparticles are homogeneously mixed within a short period at the confluence of flow passage in a Y-shaped reactor and such mixing is continuously undergone. In this reaction system, a fine flow passage is preferred to accomplish prompt mixing of the two reactant solutions and continuous mixing enables to increase the production amount. The precursor solutions to form nanoparticles are continuously supplied at the confluence by using a pump. The main factors affecting such mixing include performance of the pump to supply the individual reactant solution at the confluence. Continuously performing homogeneous supply of reactant solutions is ideal but a actual pump tends to cause more or less pulsating flow, even when based on any principles. Existence of such a pulsating flow not a little affects mixing of the two solutions. Of conventionally used pumps, any ones exhibiting as little a pulsating flow as possible are preferred and are not specifically limited. Examples of such a preferred pump include a syringe pump, a non-pulsating pump such as a triplet phase shift variation piezo-pump and a plunger pump. A pump for liquid supply, which exhibits less than 10% (preferably less than 5%) of a coefficient of variation in pressure at the confluence in a Y-shaped reactor, is preferred.

Nanosized semiconductor particles of a core/shell structure, which exhibit an average particle size of 100nm or less, a coefficient of variation of core particle size distribution of 30% or less and preferably a coefficient of variation of particle size distribution of 30% or less, are thus prepared by controlling reaction conditions in the formation of the core and the shell. Precise control of the size and its distribution of particles of a core/shell structure is thus enabled, whereby a novel composite material exhibiting superior optical characteristics can be obtained.

A method of manufacturing nanosized semiconductor particles comprised of a core (Si) and a shell ($SiO_2$), which are little scattering in particle size and uniform, is described below as a specific example of a manufacturing method employing the above-described Y-shaped reactor. This method is also applicable to nanosized semiconductor particles of a core/shell structure and having other compositions, for example, those described above.

The method comprises the steps of (i) mixing a solution of silicon tetrachloride and a reducing agent to perform reaction to form silicon Nanoparticles and (ii) heating the formed nanosized silicon particles to perform oxidation. In the step (i), homogeneously mixing is continuously conducted so as to form silicon core particles exhibiting a coefficient of variation of particle size distribution of 30% or less. In the step (ii), the heating time is controlled so as to form shelled particles (i.e., shell-covered particles) exhibiting a coefficient of variation of particle size distribution of 30% or less, whereby nanosized semiconductor particles comprised of a core portion of silicon (Si) nucleus and a shell portion of a layer mainly comprised of silicon oxide ($SiO_2$).

Reducing agents usable in the foregoing method include, for example, hydrazine sulfate, lithium aluminum hydride and sodium boron hydride. Oxidation is performed, for example, by heat oxidation in air, oxidation with oxygen gas or steam oxidation.

In the foregoing method, silicon may be crystallized as minute particles.

The reaction system as below is also preferred. In the Y-shaped reactor, two reactant solutions (a silicon tetrachloride solution and a reducing agent solution) as precursor solutions used for Nan particle formation, are supplied by a pump and mixed at the confluence within a short period. This mixing is continuous so that particle formation reaction is caused within a short diffusion distance of reactant materials in the step (i). Controlling the reaction mode or a reaction time enables to allow core particles as a reaction product to fall within a desired range of particle size distribution, that is, a coefficient of variation of core particle size being 30% or less. Specifically, the coefficient of variation of pressure of a supplying pump is preferably less than 10% and more preferably less than 5% in the flow path described above.

In the step (ii), the core portion is comprised of silicon which is easily oxidized and can easily form a layer composed mainly of silicon oxide ($SiO_2$) when subjected to an oxidation treatment, while the layer thickness can also be controlled. Thus, the thickness of a shell covering the core portion, that is, the thickness of a silicon oxide layer is controlled by adjusting either heating time or temperature for heat oxidation, or both of them. Thereby, the average particle size of the thus shelled particles falls within 100nm or less and the coefficient of variation falls within 30% or less. The structure of a core (Si) and a shell ($SiO_2$) renders it difficult to cause defects leading to lowering of optical characteristics such as a quantum effect between the core and the shell.

The range or distribution of particle sizes can be observed using a transmission electron microscope (TEM). According to the manufacturing method described above, nanosized semiconductor particles exhibiting a narrow particle size distribution can be efficiently manufactured.

In the case of nanosized semiconductor particles fixed onto the substrate, a high-frequency sputtering method is suitably applicable, as described in JP-A No. 2004-296781.

Materials used in the foregoing methods are only examples of the preferred embodiment of the invention.

The present invention will be further described with reference to examples but is not to be construed as being limited thereto. Numerical conditions such as a concentration or amount of a material used in examples, a treatment time or treatment temperature and treatment methods are only preferred examples of the invention.

EXAMPLES

Comparative Example

Silicon tetrachloride was dissolved in pure water to make a concentration of 0.1mol/L. The thus obtained solution was designated as solution A. Hydrazine sulfate was dissolved in pure water to make a concentration of 0.1mol/L. The thus obtained solution was designated as solution B. Both solutions A and B, which were maintained at 60° C., were each introduced into a Y-shaped reactor of 1 mm diameter by using pump A and were mixed to allow to react with each other. The reaction mixture was further heated at 60° C. for 1hr. under atmospheric air, whereby silicon semiconductor nanoparticles exhibiting an average particle size of 4.5 nm were obtained. The thus obtained nanoparticles were designated as Sample 1. The coefficient of variation of pressure during reaction in the foregoing Y-shaped reactor was 18%.

Example 1

Silicon tetrachloride was dissolved in pure water to make a concentration of 0.1 moi/L. The thus obtained solution was designated as solution A. Hydrazine sulfate was dissolved in pure water to make a concentration of 0.1 mol/L. The thus obtained solution was designated as solution B. Both solutions A and B, which were maintained at 60° C., were each introduced into a Y-shaped reactor of 1 mm diameter by using pump B and were mixed to allow to react with each other. The reaction mixture was further heated at 60° C. for 1 hr. under atmospheric air whereby silicon semiconductor nanoparticles exhibiting an average particle size of 4.4 nm were obtained. The thus obtained nanoparticies were designated as Sample 2. The coefficient of variation of pressure during reaction in the foregoing Y-shape reactor was 4%.

Example 2

Silicon tetrachioride was dissolved in pure water to make a concentration of 0.1 mol/L. The thus obtained solution was designated as solution A. Hydrazine sulfate was dissolved in pure water to make a concentration of 0.1 mol/L. The thus obtained solution was designated as solution B. Both solutions A and B, which were maintained at 60° C., were each introduced into a Y-shaped reactor of 1 mm diameter by using pump C and were mixed to allow to react with each other. The reaction mixture was further heated at 60° C. for 1 hr. under an atmospheric air, whereby silicon semiconductor nanoparticles exhibiting an average particle size of 4.6 nm were obtained. The thus obtained nanoparticles were designated as Sample 3. The coefficient of variation of pressure during reaction in the foregoing Y-shaped reactor was 1%.

The above-used pumps were a direct-operated single diaphragm pump (pump A), a circular eccentric cam-driving dual-coupled diaphragm pump (pump B) and a specific uniform speed cam-driven dual-coupled diaphragm pump (pump C), respectively.

The coefficient of variation of pressure was determined by measuring variation of the liquid-supplying pressure of a pump by using a pressure gauge set at the passage immediately before the two solutions were mixed in the Y-shaped reactor.

Each of the foregoing samples was observed by a transmission electron microscope to obtain electronmicrographs of 300 particles, from which the core particle size (also denoted simply as core size) and the shelled particle size (also denoted simply as particle size) were determined. The luminance (at 365 nm excitation) of each sample was determined and represented by a relative value, based on the luminance of Sample 1 being 100. Measurement of luminance was conducted in such a manner that 10 μg of particles of each sample was prepared and exposed to an ultraviolet ray of 365 nm by using FL6 BL-B, produced by NEC, and emission was measured by using CS-200, produced by Konica Minolta Sensing Co., Ltd.

The obtained results are shown in Table 1. As is apparent from Table 1, it was proved that when the coefficient of variation of pressure just prior to the crossing point of the passages for the two liquid was less than 5%, Samples 2 and 3 resulted in silicon semiconductor nanoparticles exhibiting a coefficient of variation of core particle size distribution of not more than 30%. In Samples 2 and 3, the coefficient of variation of shelled particle size distribution was also not more than 30% or close to 30%. Samples 2 and 3, as emissive particles, resulted in enhanced luminance and exhibited enhanced emission characteristics with a reduced half-width of the emission peak, as compared to Sample 1.

TABLE 1

| Sample No. | COV* of Pressure (%) | Average Core Size (nm) | COV of Core Size (%) | Average Particle Size (nm) | COV of Particle Size (%) | Luminance | Half-width of Emission Peak (nm) |
|---|---|---|---|---|---|---|---|
| 1 | 18 | 3.2 | 35 | 4.5 | 38 | 100 | 56 |
| 2 | 4 | 3.3 | 25 | 4.4 | 32 | 125 | 25 |
| 3 | 1 | 3.3 | 18 | 4.6 | 26 | 136 | 13 |

*COV: Coefficient of Variation

What is claimed is:

1. Nanosized semiconductor particles of a core/shell structure, wherein the particles each comprise a core and a shell and exhibit an average particle size of not more than 100 nm and a coefficient of variation in particle size distribution of not more than 30%, and an average core size being from 2 to 20 nm and a coefficient of variation in core size distribution being not more than 30%.

2. The semiconductor particles of claim 1, wherein the core is comprised of a composition including at least one element selected from the group consisting of B, C, N, Al, Si, P, S, Zn, Ga, Ge, As, Cd, In, Sb and Te.

3. The semiconductor particles of claim 1, wherein the core is comprised of a single crystalline substance.

4. The semiconductor particles of claim 1, wherein the shell is comprised of a composition exhibiting a greater band gap than tar of the core.

5. The semiconductor particles of claim 1, wherein the particles exhibit an average thickness of the shell of not less than 0.2 nm and not more than 1/2 of the average particle core size.

6. The semiconductor particles of claim 1, wherein the core is comprised of silicon or germanium.

7. The semiconductor particles of claim 6, wherein the core is comprised of silicon and the shell is comprised of silicon oxide.

8. The semiconductor particles of claim 7, wherein silicon oxide is silicon dioxide.

9. The semiconductor particles of claim 1, wherein core particles are prepared by a process of introducing at least two reactant solutions separately into two flow passages of a Y-shaped reactor and mixing the solutions at a confluence of the flow passages to form the core particles.

* * * * *